(12) United States Patent
Zahm et al.

(10) Patent No.: US 7,136,114 B2
(45) Date of Patent: Nov. 14, 2006

(54) TELEVISION RECEIVER WITH DYNAMICALLY ADJUSTABLE FILTERING

(75) Inventors: Michael Zahm, Waldbronn (DE); Erich Geiger, Kämpfelbach (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 292 days.

(21) Appl. No.: 10/073,817

(22) Filed: Feb. 11, 2002

(65) Prior Publication Data

US 2002/0118313 A1    Aug. 29, 2002

(30) Foreign Application Priority Data

Feb. 9, 2001    (DE) ................. 101 06 071

(51) Int. Cl.
*H04N 5/50*    (2006.01)
*H04N 5/64*    (2006.01)

(52) U.S. Cl. .............. 348/731; 348/837; 455/161.3; 455/226.2

(58) Field of Classification Search ........... 348/725, 348/731, 732, 625, 607, 838, 678, 470; 334/5, 334/40; 455/226.2, 226.3, 245.1, 245.2, 455/297, 556.1, 161.3
See application file for complete search history.

(56) References Cited

U.S. PATENT DOCUMENTS

| | | | |
|---|---|---|---|
| 3,564,125 A * | 2/1971 | Avins | 348/725 |
| 3,755,618 A * | 8/1973 | Poppy | 348/644 |
| 3,852,522 A | 12/1974 | Martin | 178/5.8 |
| 3,936,599 A * | 2/1976 | Peil et al. | 348/682 |
| 3,971,064 A * | 7/1976 | Milbourn | 348/627 |
| 4,107,730 A * | 8/1978 | Jones | 348/627 |
| 4,780,909 A * | 10/1988 | Sakashita et al. | 455/161.3 |
| 5,095,534 A | 3/1992 | Hiyama | 455/266 |
| 5,101,509 A * | 3/1992 | Lai | 455/183.1 |
| 5,105,273 A * | 4/1992 | Hyakutake | 348/726 |
| 5,821,838 A | 10/1998 | Suzuki et al. | 334/47 |
| 6,473,134 B1 * | 10/2002 | Nohara et al. | 348/614 |
| 2003/0040272 A1 * | 2/2003 | Lelievre et al. | 455/3.06 |

FOREIGN PATENT DOCUMENTS

| | | |
|---|---|---|
| DE | 3014983 | 11/1980 |
| EP | 0 455 974 | 3/1991 |
| GB | 2 059 223 | 8/1979 |

* cited by examiner

*Primary Examiner*—Victor R. Kostak
(74) *Attorney, Agent, or Firm*—O'Shea, Getz & Kosakowski, P.C.

(57) ABSTRACT

A television receiver includes a tuner stage, a selective filter stage connected to the tuner stage, and a intermediate-frequency stage connected to the selective filter stage. A field-strength-detection stage is also provided, which generates a field strength signal proportional to the field strength of the received signal. The selective filter stage includes a transfer function that is modifiable by a control signal derived from the field strength signal.

22 Claims, 3 Drawing Sheets

TELEVISION RECEIVER WITH DYNAMICALLY ADJUSTABLE FILTERING

BACKGROUND OF THE INVENTION

The present invention relates generally to a television receiver, and in particular to a mobile television receiver.

Unlike stationary television receivers, mobile television receivers encounter constantly changing reception conditions. For example, when a mobile television receiver is installed in a vehicle, the position of the antenna changes with the position of the vehicle. In contrast to an antenna of a stationary television receiver which can be optimally aligned and fixed once, a mobile television receiver and its antenna will be located in many positions relative to the transmitter, resulting in a continually changing reception. For this reason, during the development of mobile television receivers, special attention has been paid to the response of the television receiver given low levels of reception.

A low level of reception indicates a high noise component in the useful signal. The consequences of a small signal/noise ratio manifest themselves in a subjectively barely discernable picture, loss of horizontal or vertical synchronization, onset of color suppression, or even complete loss of picture. This response is essentially caused by the unlocking of the phase-locked loops (PLL) for video signal processing, by unsteady synchronous pulse separation, by disturbed automatic gain controls (AGC), and defective color subcarrier recovery.

For example, should the synchronous demodulator of the frequency phase-locked loop (FPLL) unlock while the intermediate frequency is being converted to baseband, a complete loss of picture will occur. In addition, a loss of lock causes an extended dead period for the entire system, since each phase-locked loop requires a certain period of time to return to a new lock-in state.

In those applications in which the received video signal is utilized for subsequent transmission in a multimedia system, a compression method (e.g., MPEG) is generally employed to reduce the transmission bandwidth. The algorithms used in such compression methods reduce the transmitted information, depending for example on the video information and its modifications. Video content with a uniform form thus requires a lower bit rate for transmission, while a more detail-rich video content requires a higher one. However, the noise components in the video signal are interpreted by the compression algorithm as detail-rich image modifications.

Therefore, there is a need for a television receiver having improved performance during mobile use.

SUMMARY OF THE INVENTION

Briefly, according to an aspect of the present invention, a television receiver includes a tuner that receives a transmitted signal from an antenna; a selective filter stage connected to the tuner; an intermediate-frequency stage connected to the selective filter stage; at least one field-strength-detection stage that generates a field strength signal proportional to the field strength of the received signal, and which generates a control signal derived from the field strength signal, where the selective filter stage implements a transfer function that is modifiable by the control signal.

In another aspect of the invention, a television receiver comprises a tuner that receives a transmitted signal from an antenna; a first selective filter stage connected to the tuner, the selective filter stage implementing a transfer function that is modifiable by one or more control signals derived from a field strength signal; and an intermediate-frequency stage connected to the selective filter stage and generating a first control signal of the one or more control signals.

In yet another aspect of the invention, a television receiver comprises a tuner that receives a transmitted signal from an antenna; a first selective filter is connected to the tuner for implementing a transfer function modifiable in response to one or more control signals, which are generated in response to detected field strength of the received signal.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
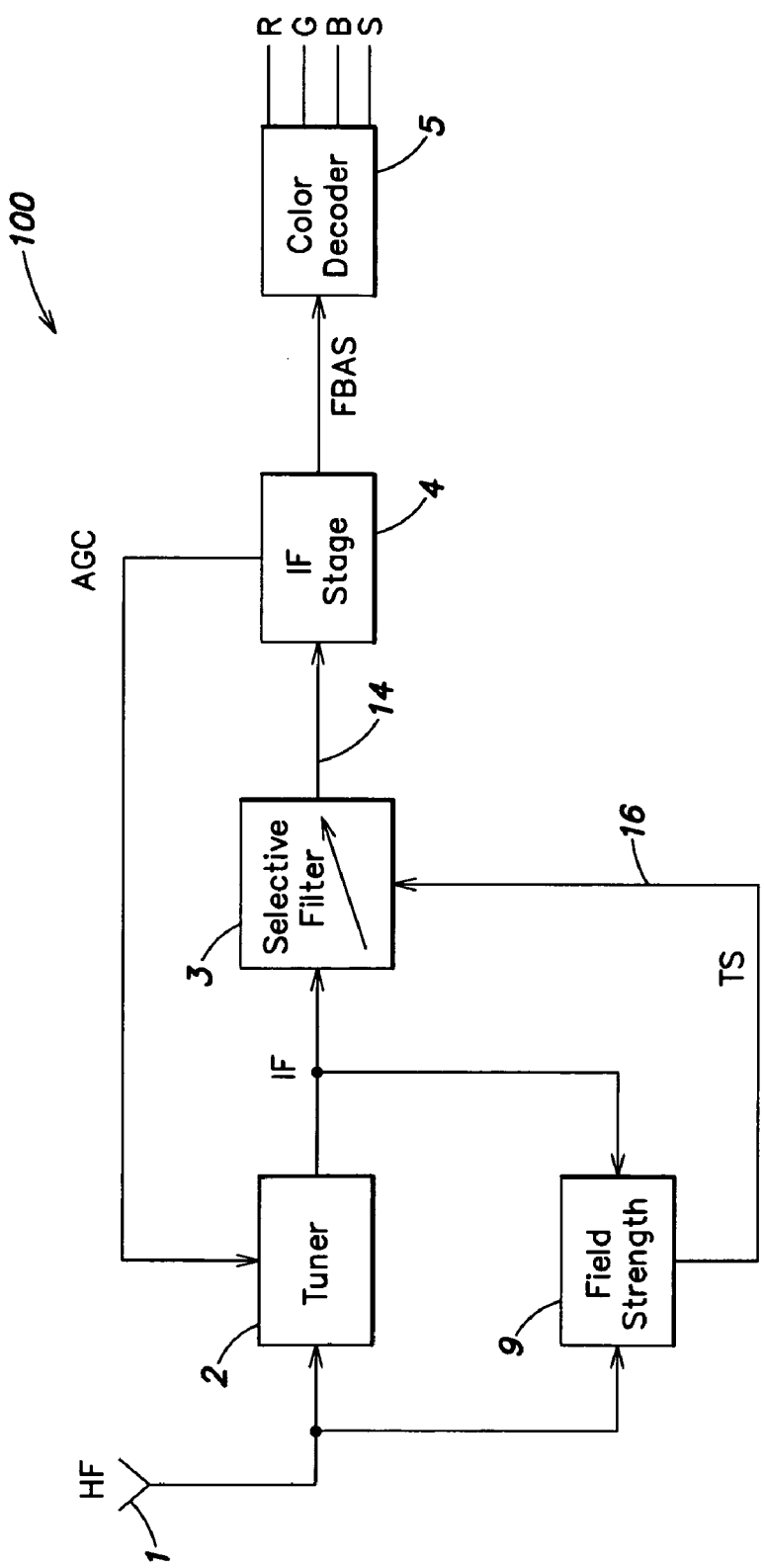
FIG. 1 illustrates a first embodiment of a television receiver having a controllable selective filter stage.

FIG. 1 is a schematic block diagram of a mobile television receiver 100. A high-frequency (HF) signal is received by an antenna 1, which provides a received signal to a tuner 2. The tuner provides an intermediate-frequency (IF) signal, for example, by mixing the received signal with a carrier signal. The sensitivity of the tuner 2 is determined by an automatic gain control (AGC) signal.

The IF signal is input to a selective filter 3 that filters the IF signal and provides a filtered signal on a line 14 to an intermediate-frequency stage 4, which generates an FBAS color signal. Significantly, the transfer function of the selective filter 3 can be modified by a control signal TS on a line 16. The control signal AGC and the control signal TS are derived from a field strength signal generated in a field-strength-detection stage 9.

Typically, the field strength signal generated by the field-strength detection stage 9 is proportional to the field strength of the HF signal. In one embodiment, the control signal TS is equal to the field strength signal, although there may be other relationships between the field strength signal and the control signal TS. In this embodiment, the field-strength-detection stage 9 generates the field strength signal based on the signals input to and/or output from the tuner stage 2. This field strength signal is provided to the selective filter stage 3 as control signal TS. A color decoder 5 is connected to the intermediate-frequency stage 4 to generate four color signals R, G, B, and S [black] from the FBAS video signal.

Figure 2:
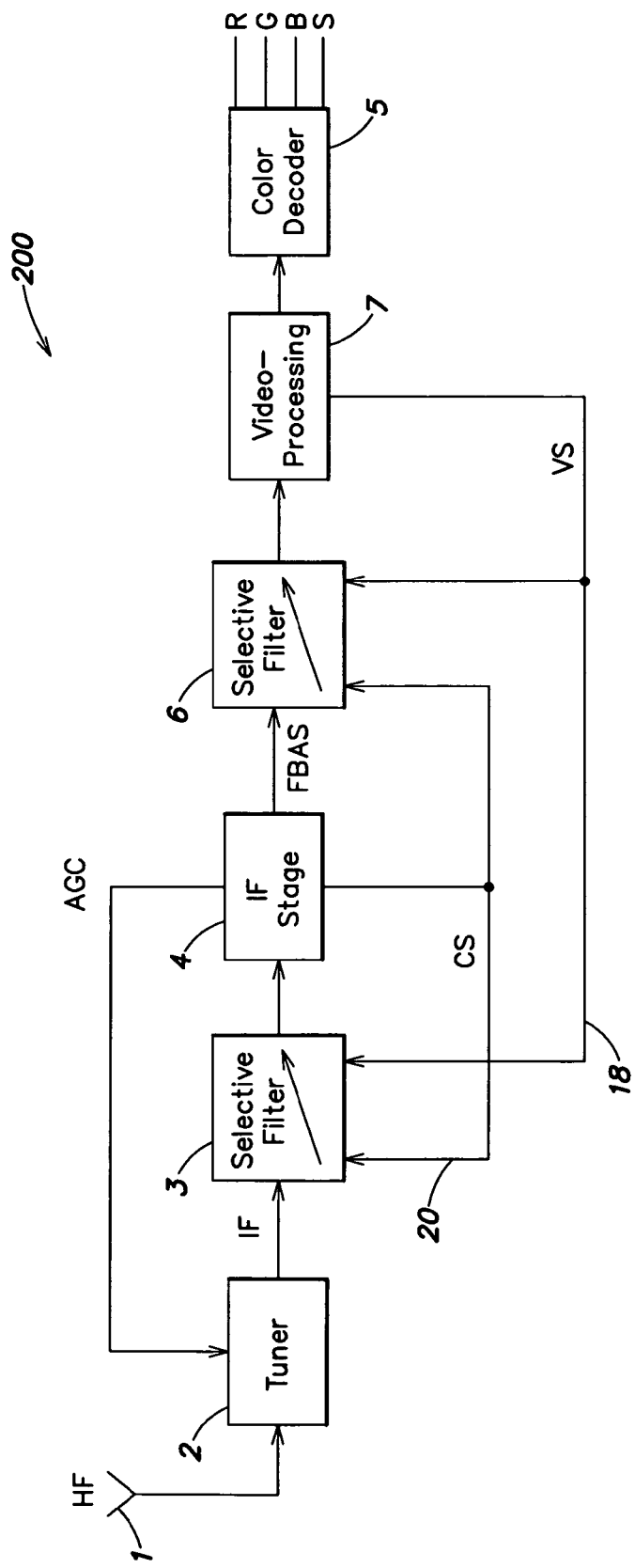
FIG. 2 illustrates a television receiver having two controllable selective filter stages.

FIG. 2 is a schematic block diagram of an alternative embodiment television receiver 200. The television receiver 200 receives the high-frequency HF signal at the antenna 1, which feeds the high-frequency signal HF to the tuner 2. The sensitivity of the tuner 2 is determined by an automatic gain control (AGC) signal generated by the intermediate-frequency stage 4. The tuner 2 generates an intermediate-frequency (IF) signal that is input to the selective filter stage 3. The intermediate-frequency signal IF is fed to the intermediate-frequency stage 4, which generates the AGC signal, and an FBAS color signal.

The embodiment in FIG. 2 is modified relative to that in FIG. 1 so that the transfer function implemented in the selective filter stage 3 is controlled by at least two control signals, rather than the control signal TS on the line 16 (FIG. 1) generated by the field strength detector stage 9 (FIG. 1). In this embodiment, the selective filter 3 is responsive to at least two control signals, VS and CS, on lines 18, 20 respectively. An additional selective filter stage 6 and video-processing stage 7 are interconnected between the intermediate-frequency stage 4 and the color decoder 5. In this embodiment, the selective filter stage 6 implements a transfer function that can be modified similar to the transfer function implemented in the selective filter 3, at least at certain individual points of the transfer function. Control of the additional selective stage 6 is achieved by the control signal CS on the line 20 and the control signal VS on the line 18.

The control signal VS on the line 18 is generated by the video signal processing device 7, while the control signal CS on the line 20 is supplied by the intermediate-frequency stage 4. The control signal CS is derived from information present in the intermediate-frequency stage 4. The control signal VS is generated by the video signal processing device 7 from signals that qualify the picture quality.

Figure 3:
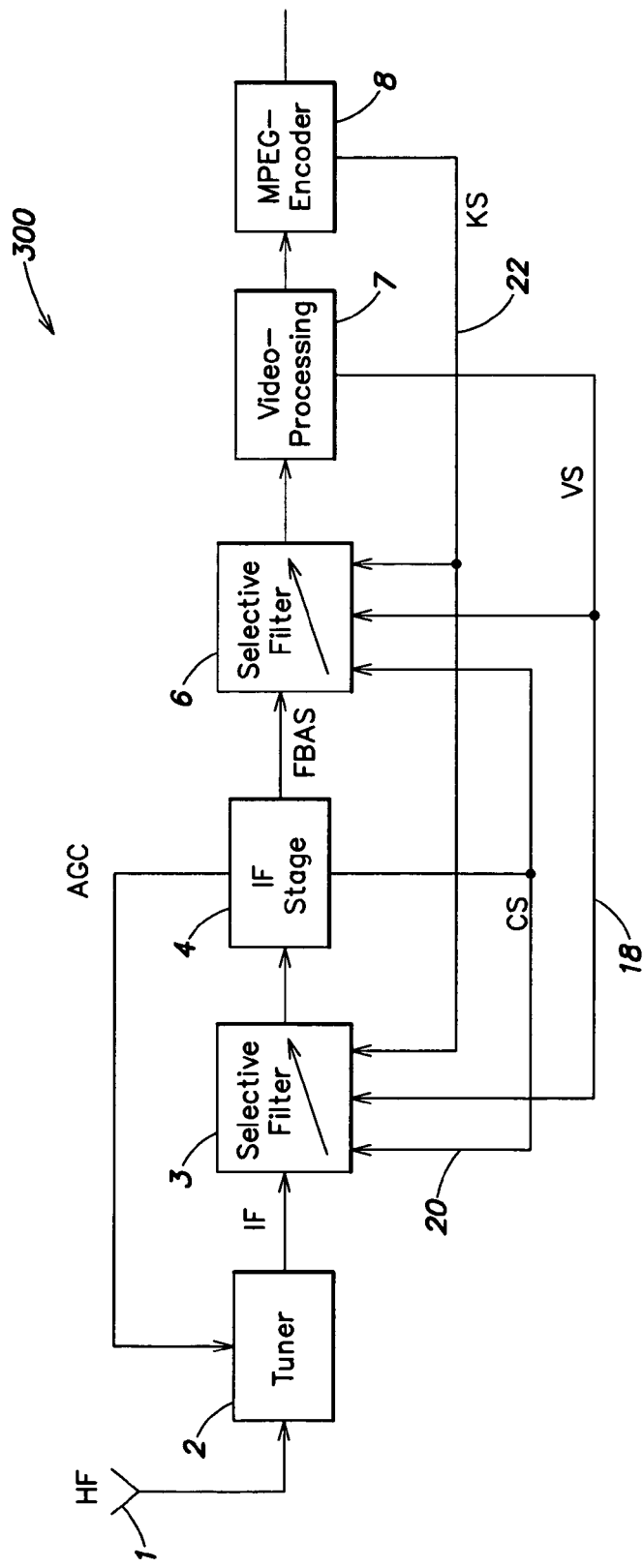
FIG. 3 illustrates a television receiver having two controllable selective filter stages and an expanded control signal.

FIG. 3 is a schematic block diagram of another television receiver 300, which is an evolution of the embodiment of the television receiver 200 illustrated in FIG. 2. Accordingly, only that which is different than television receiver 200 is described in detail below. The television receiver 300 includes a picture-data-compression stage 8 (e.g., an MPEG encoder), which replaces the color decoder 5 (FIG. 2), and is connected to the video-processing stage 7.

In accordance with this embodiment of the invention, the selective filter stage 3 is not controlled by the control signal TS on the line 16 (FIG. 1) from the tuner stage 2 as in the television receiver 100 (FIG. 1). Instead, the selective filter 3 of the television receiver 300 is controlled by at least three control signals. Specifically, the selective filter 3 is responsive to the control signals VS and CS on lines 18, 20, and by a control signal KS on a line 22 that is supplied by the picture-data-compression stage 8. The control signal KS on the line 22 is derived from information on the real-time picture quality.

In the exemplary embodiments of the television receiver described above, the selective filter stages 3 and 6 can implement low-pass or band-pass filters, while high-pass filters may also be used at the intermediate-frequency level. In addition, notch filters or frequency traps may also be used in certain applications. Specifically, a slope trap before the intermediate frequency stage 4 has been successfully employed. This trap is designed such that, in response to increased use, the spectral components of the chrominance signal are more strongly suppressed, while in response to weaker use, the noise components within the spectral range of luminance and chrominance are reduced.

In the selective filter stages the position of the pass-band or stop-band (their width and slope) can be modified by the specific control signals CS, TS, and KS. By reducing the bandwidth, noise components are suppressed or reduced, while the spectral components most important for the useful signal may fall within the pass-band of the filter. This can be achieved, for example, in response to modifying the position of the pass-band of the filter. In this way, the frequency phase-locked loop of the synchronous demodulator can remain locked for a longer period during demodulation of the intermediate-frequency IF in the intermediate-frequency stage 4. The filters following the intermediate-frequency stage 4 and thus the demodulation may, for example, form the FBAS video signal in such a way that the subsequent signal-processing stages, such as the color decoder 5 or the picture-data-compression stage 8, can maintain their function for a longer period.

Preferably, the filter curves are designed to fit the requirements of the following functional stages, whereby especially subjective factors can also be taken into account. For example, given a very weak signal, the viewer often finds it less objectionable when only black-and-white components of the picture are displayed. Loss of synchronization or a stationary picture, on the other hand, are found to be much more objectionable. In addition, a reduction in the high-frequency picture components creates a kind of soft-focus effect that also creates a more pleasant impression of the image given poor reception of the signal. Accordingly, in a further embodiment of the invention, only the black-and-white signals contained in the received signal are allowed to pass through the selective filter stage(s) given a signal of low field strength. Additionally or alternatively, given a low-field-strength signal, the higher-frequency video signals contained in the received signal may also be suppressed by the selective filter stage(s).

The filter stages may be controlled so that there is no effect on the useful signal given an acceptable received signal, while in response to a degrading received signal the selective filter stages adapt continually or in increments to the reception conditions. In this way, a significant improvement in reception is achieved.

The field strength information is obtained by the field-strength-detection stage 9 in the television receiver 100 (FIG. 1), which detects the received signal either before or after the tuner stage 2. In addition, the field strength information may be also derived from the control voltage of the intermediate-frequency stage 4. Therefore, in all three cases, a control signal is generated that is proportional to the field strength.

In addition, at least one more control signal VS may be provided which links the field strength information to additional information, specifically picture quality information, from the following, specifically quality-evaluating stages. This information may, for example, include: loss of synchronization, noise component in the picture, increase in or insufficient bit rate. This information may affect filter stages 3, 6 in differing ways, for example, in terms of response time or their transfer function.

Although the present invention has been shown and described with respect to several preferred embodiments thereof, various changes, omissions and additions to the form and detail thereof, may be made therein, without departing from the spirit and scope of the invention.

What is claimed is:

What is claimed is:

1. A television receiver comprising:
   a tuner that receives a transmitted signal from an antenna and bandshifts the transmitted signal to an intermediate frequency and provides a received signal indicative thereof;
   a selective filter stage that receives the received signal containing chrominance and luminance components and provides a filtered signal;
   an intermediate-frequency stage that receives the filtered signal and processes the filtered signal to provide a processed signal; and
   at least one field-strength-detection stage that receives the transmitted signal, and generates a field strength signal proportional to the field strength of the transmitted signal, and which generates a control signal derived from the field strength signal, where the selective filter stage implements a transfer function that is modifiable by the control signal.

2. The television receiver of claim 1, where the bandwidth of the selective filter stage is modified as a function of the control signal.

3. The television receiver of claim 1, where the selective filter stage comprises a frequency trap, the slope of which is modifiable by the control signal.

4. The television receiver of claim 3, where one chrominance signal and one luminance signal are contained in the received signal,
and where the frequency trap is dimensioned such that, in response to a higher field strength signal, spectral components of the chrominance signal are more strongly suppressed, while in response to a lower field strength signal noise signals in the spectral range of luminance and chrominance signal are reduced.

5. The television receiver of claim 1, where a black-and-white signal is contained in the received signal and, in response to a low field strength signal, only black-and-white signals are transmitted by the selective filter stage.

6. The television receiver of claim 5, where the received signal includes a video signal, and where
in response to a low field strength signal, higher-frequency video signals are suppressed by the selective filter stage.

7. The television receiver of claim 1, where the selective filter stage is controlled such that given a field strength signal above a certain threshold value there is no effect on the signal by the selective filter stage.

8. The television receiver of claim 1, where in response to a degrading signal, the selective filter stage adapts the filter response continually or in steps.

9. The television receiver of claim 1, where the at least one field-strength-detection stage evaluates the received signal and generates the field strength signal.

10. The television receiver of claim 1, where the at least one field-strength-detection stage comprises the intermediate-frequency stage, where the intermediate-frequency stage generates the field strength signal.

11. The television receiver of claim 1, where the field strength detector is also responsive to the processed signal.

12. A television receiver comprising:
a tuner that receives a transmitted signal from an antenna and bandshifts the transmitted signal to an intermediate frequency and provides a received signal indicative thereof;
a first selective filter stage that receives and filters the received signal to provide a filtered signal, wherein the selective filter stage implements a transfer function that is modifiable by one or more control signals derived from a field strength signal; and
an intermediate-frequency stage that receives and processes a signal indicative of the filtered signal to provide a processed signal and generates a first control signal of the one or more control signals.

13. The television receiver of claim 12, where the first selective filter stage modifies the bandwidth of the implemented transfer function based on the one or more control signals.

14. The television receiver of claim 12, where the television receiver further comprises:
a second selective filter stage connected to the intermediate-frequency stage, the second selective filter stage being controlled by at least one of the one or more control signals.

15. The television receiver of claim 14, where at least one of the first and second selective filter stages implements a frequency trap having a slope that is modifiable in response to the one or more control signals.

16. The television receiver of claim 15, where one chrominance signal and one luminance signal are contained in the received signal, and where the frequency trap is dimensioned such that, in response to a higher field strength signal, spectral components of the chrominance signal are more strongly suppressed, while in response to a lower field strength signal noise signals in the spectral range of luminance and chrominance signal are reduced.

17. The television receiver of claim 14, where a black-and-white signal is contained in the received signal and, in response to a low field strength signal, only black-and-white signals are transmitted by the first and second selective filter stages.

18. The television receiver according to claim 14, where the received signal comprises a video signal, and where, in response to a low field strength signal, higher-frequency video signals are suppressed by one or more of the first and second selective filter stages.

19. The television receiver according to claim 14, where in response to a degrading signal the first and second selective filter stages implement respective filter responses either continually and in increments.

20. The television receiver of claim 14, where the television receiver further comprises:
at least one additional signal-processing stage connected to and following the intermediate-frequency stage, where at least one of the one or more control signals is derived from at least one signal from the at least one additional signal-processing stage.

21. The television receiver of claim 14, further comprising a video signal processing device that receives the output signal from the second selective filter stage and provides a second control signal of the one or more control signals.

22. A mobile television receiver comprising:
a tuner that receives a transmitted signal from an antenna and bandshifts the transmitted signal to an intermediate frequency and provides a received signal indicative thereof;
a selective filter stage that receives the received signal containing chrominance and luminance components and provides a filtered signal;
an intermediate-frequency stage that receives the filtered signal and processes the filtered signal to provide a processed signal; and
at least one field-strength-detection stage that receives the received signal, and generates a field strength signal proportional to the field strength of the received signal, and which generates a control signal derived from the field strength signal,
where the selective filter stage implements a transfer function that is modifiable by the control signal.

* * * * *

UNITED STATES PATENT AND TRADEMARK OFFICE
CERTIFICATE OF CORRECTION

| | | |
|---|---|---|
| PATENT NO. | : 7,136,114 B2 | Page 1 of 1 |
| APPLICATION NO. | : 10/073817 | |
| DATED | : November 14, 2006 | |
| INVENTOR(S) | : Zahm et al. | |

It is certified that error appears in the above-identified patent and that said Letters Patent is hereby corrected as shown below:

Column 4
Line 51, delete "What is claimed is:"
In the claims, claim 1, line 54, delete "bandshifis" and insert --bandshifts--.

Signed and Sealed this

Ninth Day of January, 2007

JON W. DUDAS
*Director of the United States Patent and Trademark Office*